United States Patent
Patz et al.

(10) Patent No.: US 6,554,980 B1
(45) Date of Patent: Apr. 29, 2003

(54) VACUUM TREATMENT APPARATUS FOR DEPOSITION OF THIN LAYERS ON THREE-DIMENSIONAL SUBSTRATES

(75) Inventors: Ulrich Patz, Linsengericht (DE); Gerd Ickes, Hainburg (DE)

(73) Assignee: Leybold Optics GmbH, Alzenau (DE)

( * ) Notice: Subject to any disclaimer, the term of this patent is extended or adjusted under 35 U.S.C. 154(b) by 639 days.

(21) Appl. No.: 08/951,402

(22) Filed: Oct. 16, 1997

(30) Foreign Application Priority Data

Oct. 17, 1996 (DE) .......................................... 196 42 852

(51) Int. Cl.$^7$ ........................... C23C 14/34; C23C 16/00
(52) U.S. Cl. ........................... 204/298.25; 204/298.23; 204/298.26; 204/298.28; 118/719; 156/345.31
(58) Field of Search ....................... 204/298.23, 298.25, 204/298.26, 298.28; 118/719; 156/345

(56) References Cited

U.S. PATENT DOCUMENTS

| | | | |
|---|---|---|---|
| 3,856,654 A | 12/1974 | George | 204/298 |
| 3,915,117 A | 10/1975 | Schertler | 118/49 |
| 4,294,194 A | 10/1981 | Behn et al. | 118/719 |
| 4,643,629 A | * 2/1987 | Takahashi et al. | 204/298.25 |
| 4,886,592 A | * 12/1989 | Anderle et al. | 204/298.25 |
| 5,183,547 A | * 2/1993 | Ikeda | 204/298.25 |
| 5,379,984 A | 1/1995 | Coad et al. | 251/298 |
| 5,415,729 A | 5/1995 | Strasser et al. | 216/67 |
| 5,518,599 A | * 5/1996 | Schwartz et al. | 204/298.25 |
| 5,698,039 A | * 12/1997 | Patz et al. | 204/192.1 |
| 5,709,785 A | * 1/1998 | LeBlanc, III et al. | 204/298.25 |

FOREIGN PATENT DOCUMENTS

| | | | |
|---|---|---|---|
| DE | 2241634 | 3/1973 | C23C/15/00 |
| DE | 2454544 | 7/1975 | C23C/13/08 |
| DE | 2848480 | 11/1984 | H01G/4/30 |
| DE | 4235676 | 6/1994 | B65G/49/07 |
| DE | 4319893 | 9/1994 | B65G/57/24 |
| EP | 0136562 | 1/1985 | C23C/14/56 |
| EP | 0555764 | 8/1993 | C23C/14/22 |

OTHER PUBLICATIONS

DERWENT record for EP 555 764.
DERWENT record for DE 22 41 634.
DERWENT record for DE 24 54 544.
DERWENT record for DE 28 48 480.
DERWENT record for DE 4235676 A1.
DERWENT record for DE 4319893 C1.
DERWENT record for JP 1218627 A.

* cited by examiner

Primary Examiner—Rodney G. McDonald
(74) Attorney, Agent, or Firm—Fulbright & Jaworski L.L.P.

(57) ABSTRACT

In a vacuum treatment apparatus for deposition of thin layers on shell-shaped substrates (2, 2', . . . ) with a plurality of treatment stations (8, 9) and airlock stations (10, 20) held by an otherwise closed stationary circular cylindrical vacuum chamber wall (7) and a with rotatably arranged inner wall cylinder (14) which holds the treatment stations (3 through 6) and which inner wall is enclosed by the vacuum chamber wall (7) and in which vacuum chamber wall openings (25, 26, 27, 28) are provided, which openings are capable of overlapping the substrate chambers (3 through 6) and through which openings the treatment agents can act upon the substrates (2, 2'), and with an outer wall (16, 16') enclosing the vacuum chamber wall, and in which apparatus there are provided two airlock stations (10, 20) which are located diametrically opposite each other and tangentially to the outer wall of the vacuum chamber (7), and to each of these two airlock stations (10, 20) there is assigned a substrate conveyor (19 or 22) which conveyor alternately transports a substrate to the airlock station (10, 20) or away from the airlock station (10, 20), where the loading or unloading of substrates (2, 2'), located at the time in the vicinity of the airlock station, occurs dependent on the rotational motion of the inner cylinder.

8 Claims, 1 Drawing Sheet

VACUUM TREATMENT APPARATUS FOR DEPOSITION OF THIN LAYERS ON THREE-DIMENSIONAL SUBSTRATES

FIELD OF INVENTION

The invention relates to a vacuum treatment apparatus for deposition of thin layers on three-dimensional shell-shaped or prismatic substrates with a plurality of treatment stations held by a stationary circular cylindrical vacuum chamber wall of the otherwise closed vacuum chamber and with an inner cylinder enclosed by the vacuum chamber wall which inner cylinder holds the substrate chambers, with openings provided in the vacuum chamber wall which can be aligned with the substrate chambers and through which treatment agents can act upon the substrates.

BACKGROUND OF THE INVENTION

A disadvantage of known devices is in costly construction and frequently also in that they can only be used for very specific, for example flat discoid material. Inward and outward movement of substrates through the airlocks has frequently caused difficult sealing problems which were solved through costly airlock construction.

DE-OS 22 41 634 discloses a vacuum coating apparatus of the kind described above, where the transport system has pot-shaped carriers for holding of the substrate, arranged in pivotable manner about a common axis and where, while in a treatment position, namely in the inward/outward moving position, such a carrier itself forms the wall of the inward/outward movement chamber and a movable valve plate is provided for the blocking of a face-side of the carrier which forms the entry-and-exit chamber. In this vacuum treatment apparatus the inward and outward movement through the airlocks of the material to be coated is solved by a simple construction. However, subsequent transport of the material to be coated, especially into the vapor coating position, is complicated. A further rotation of the transport device brings the pot-shaped carriers holding the material into a transfer position from where the individual substrates are lifted out of the pot-shaped carrier and moved upward into the actual coating chamber by a lifting device acting from below. This results not only in a considerable construction expense but also in a complicated and time-consuming operation.

From DE 24 54 544 there is additionally known a vacuum coating apparatus for vacuum deposition of thin layers on substrates, with an entry chamber, additional substrate treatment or coating chambers and an exit chamber, as well as with a transport device for the transport of the substrates through the chambers, arranged in, the main, evacuable chamber with sealing devices provided for temporary sealing off between the above chambers and the main chamber, where the transport device has carriers for holding of the material to be coated, said carriers being arranged about a common axis in a pivotable manner, where in at least two treatment positions, namely an entry and exit position and a coating position, one such carrier itself forms a part of the wall of a treatment chamber, namely an entry and exit chamber and a coating chamber, where in at least one of these treatment positions a movable valve plate is provided for blocking a face part of the carrier which forms a part of the treatment chamber.

Also known is a device for deposition of layers on substrates in a vacuum (DE 28 48 480), in particular for the alternating deposition of metal layers and glow polymerization layers on substrates in the production of electric layer condensers, which discloses at least two vacuum chambers separated from each other by vacuum airlocks, where in the first vacuum chamber a lesser residual pressure exists during operation than in the second chamber or in the remaining chambers, where a transport device capable of transporting the substrates through one separate vacuum airlock at a time from the first vacuum chamber into a second vacuum chamber or into a third vacuum chamber is provided, where the vacuum chambers contain devices for the deposition of layers onto the substrates positioned on the transport carriers and where the vacuum airlocks each have a plurality of jaws positioned directly opposite a surface or surfaces of the transport device permitting only a narrow opening toward them and each having a suction pipe for the suctioning off of gas residue, where the transport device is movable in only one direction, where the vacuum airlock in front of the first vacuum chamber in the direction of movement of the transport device has longer diffusion paths than those behind the vacuum airlock of the first vacuum chamber in the direction of movement of the transport device.

Finally, a vacuum treatment apparatus for the treatment of substrate surfaces or work pieces is known (EP-A-0 555 764) which is of cylindrical configuration and where at least one intake chamber or receptacle for receiving the substrate to be treated is arranged along the mantle of a circular or cylindrical distribution chamber, with peripheral openings directed outward, which openings are, when in the respective treatment positions, directed opposite the corresponding treatment stations arranged in the cylinder mantle, in order to form the treatment or process chamber, and which intake chamber or receptacle or the cylinder mantle are arranged rotatably about the cylinder center axis so that the intake chambers or receptacles are movable relative to the cylinder mantle in order to be moved from one treatment station to the next, where in one part or all of the intake chambers or receptacles and/or treatment stations are provided with pneumatically or hydraulically activated seals for separating and sealing the treatment or process chambers during the treatment process.

The object of the invention is to create an apparatus of the type in question, suitable for treatment of three-dimensional, shell-shaped or prismatic substrates in such a manner that during a single work cycle several substrates which are being transported by separate conveyors, can be brought in or taken out through the airlock and treated simultaneously.

SUMMARY OF THE INVENTION

The object is accomplished according to the invention by two airlock stations positioned diametrically opposite each other and tangentially relative to the outer wall, where to each one of these two airlock stations one substrate conveyor is assigned, which conveyor alternates in transporting a substrate to the airlock station or away from it, where the inward or outward passage through the airlock of the substrate located at the moment in the area of the airlock occurs dependent on the rotational motion of the inner cylinder, where in each instance the conveyor transports, with a first movement, substrates from the airlock station to the processing station and subsequently, in a second movement, transports the substrate from the processing station back to the airlock station.

Additional particulars and features are described in more detail and characterized in the attached patent claims. The invention permits a great variety of embodiments, one of which is illustrated in a purely schematic manner in the attached as FIG. 1.

Figure 1:
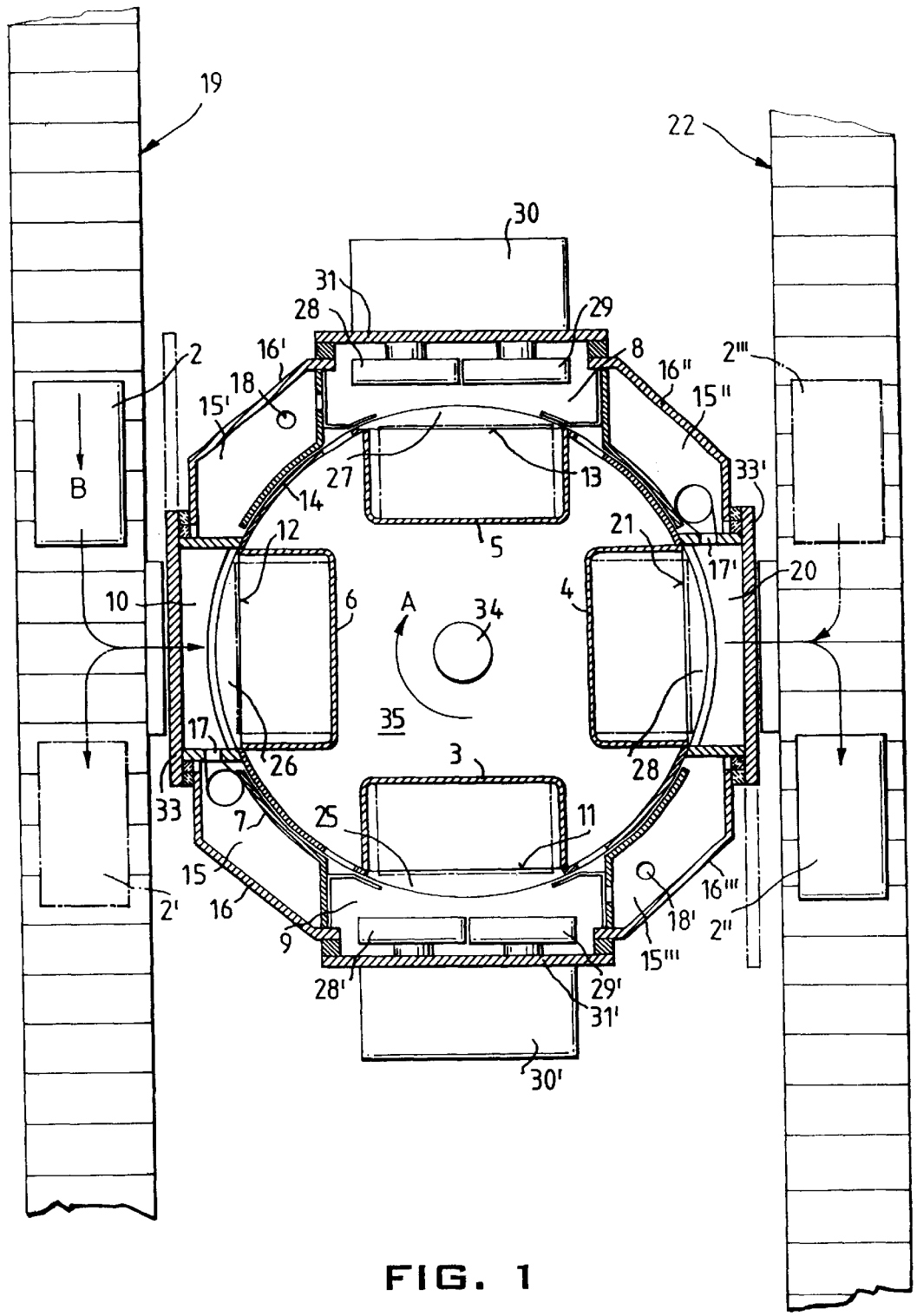
FIG. 1—is a cross section view of the vacuum treatment apparatus and a top view of the substrate transport device working together with the vacuum treatment apparatus.

Reference Designations 2, 2' Substrate 3 Substrate chamber
4 Substrate chamber
5 Substrate chamber
6 Substrate chamber
7 Circular cylindrical vacuum chamber wall
8 Treatment station
9 Treatment station
10 Loading/unloading station, airlock chamber
11 Opening
12 Opening
13 Opening
14 Cylindrical wall, inner cylinder
15 ', . . . Outer chamber
16 16', . . . Outer wall
17 17', . . . Bore hole
18 18', . . . Gas inlet nipple
19 Plate band conveyor
20 Loading/unloading station, airlock station
21 Opening
22 Plate band conveyor
24 Opening
25 Opening
26 Opening
27 Opening
28 Sputter cathode
29 29' Sputter cathode
30 30' Power supply
31 31' Outer wall
33,33' Cover, airlock lid
34 Motor
35 Plate

DETAILED DESCRIPTION OF THE INVENTION

The vacuum treatment apparatus discloses a circular cylindrical vacuum chamber 7 which is provided with several, window-like openings 24 through 27, uniformly distributed on the chamber's mantle surface, where to each opening 24 through 27 one treatment station 8, 9, or loading/unloading station 10, 20 is assigned, each of which stations comprises a box-shaped housing open on the side facing the respective openings 24 through 27, and whose circumferential edge is fixed to the cylindrical wall of the vacuum-chamber 7. The vacuum chamber 7 encloses an inner cylinder 14, which is provided with openings 11, 12, 13, 21 which openings correspond to the abovementioned openings in vacuum chamber 7 and are set into the box-shaped substrate chambers 3 through 6, which chambers, together with the loading/unloading stations 10, 20 each form receptacles enclosed on all sides when the inner cylinder 14 is in the position shown in drawing. The vacuum chamber wall 7 is encompassed by the outer wall parts 16, 16', . . . , which parts are each fixed to the wall parts of treatment stations 8, 9 or the loading/unloading stations 10, 20 and thus form, together with chamber wall 7 the outer chambers 15, 15". Two of these outer chambers 15, 15' are connected by bores 17, 17' with the inner walls of two loading stations 10, 20, where the outer walls 16, 16" of these two outer chambers 15, 15" are fixed to vacuum pumps through which the spaces 3 through 6 or the interior of the inner cylinder 14 can be evacuated. Moreover, gas inlet connections 18, 18' for processing gases are provided so that coating can be accomplished in the treatment stations 8, 9. In the housing of the treatment stations 8, 9 are provided in each case two sputter cathodes 28, 29, 28', 29' while the necessary power supply 30, 30' is affixed to the outer walls 31, 31' of the treatment stations 8, 9. Covers 33, 33' are moveable into the positions indicated by broken lines, for the purpose of loading and unloading. All chambers, i.e., treatment chambers 8, 9, airlock chambers 10, 20, substrate chambers 3 through 6, outer chambers 15, 15', . . . and the inner cylinder 14 are covered by a common base plate 35 and a cover plate which is not shown, so that an especially simple construction results. It is obvious that the inner cylinder with at least one circular plate 35 must be torsionally connected with motor 34 so that the structure formed by inner cylinder 14 and the substrate chambers 3 through 6 can rotate within the actual vacuum chamber 7.

The apparatus for deposition of thin layers on substrates shown can be simultaneously supplied with substrates over two plate belt conveyors 19, 22 in such a manner that in each instance two substrates are loaded, coated or unloaded, for which motor 34 in each instance rotates the inner cylinder 14 in the direction of the arrow A (clockwise) by a quarter turn.

In the embodiment shown in the drawing the substrate 2 has been moved in the direction of arrow B to a position just short of the loading/unloading station 10 by the plate conveyor 19; in this stage of the production process, a substrate 2' which has already been treated in station 9, is being unloaded from chamber 6 and transported to the position indicated by the broken line. Simultaneously with this operation the substrate 2" has been pushed from chamber 4 onto the conveyor 22 and substrate 2''' (represented by a broken line) has been prepared for loading. During the next stage the two ready substrates 2 and 2''' are loaded into chambers 6 or 4 and the chambers 6, 4 are thereupon closed by covers 33 or 33'. During the next stage the inner cylinder is turned in the direction of arrow A by 90° whereby the two substrates 2, 2''' are transported in front of the sputter cathode pairs 28, 29, or 28', 29' where they are subsequently coated. Simultaneously with the transport of substrates 2, 2''' in front of the cathode stations the substrates previously located in these positions are transported into the loading/unloading positions, i.e., in front of the openings 12 or 21.

During the production process described above the coating apparatus is simultaneously supplied with two substrates 2, 2''' in a so-called H-track and two substrates 2', 2" are removed from the apparatus in such a manner that the substrate being delivered on the conveyor 19 is removed on conveyor 22 arranged parallel on the opposite side of the apparatus (and vice versa).

However, it is also easily possible to remove after treatment in the coating apparatus the substrates 2, 2', . . . that were delivered by transport conveyor 19 or 22, in a so-called Ω track, via the same conveyor. This method has the advantage that the substrates can be subjected to two treatments since the substrates pass through both cathode stations 28, 29 and 28', 29' until they are ejected after one full revolution of the inner cylinder 14.

Lastly, the apparatus permits operation in a so-called Λ track. In this mode, two substrates 2, 2', . . . are simultaneously inserted, treated and ejected in each case. As opposed to the H track the rotation of the inner cylinder 14 does not remain in the same direction. After each 90° turn the direction is changed so that the substrate inserted on one side is ejected on the same side after treatment and is transported away by the same conveyor.

What is claimed:

1. A vacuum treatment apparatus for simultaneously depositing thin layers on at least two three-dimensional substrates, said apparatus comprising:

a vacuum chamber having a generally circular cylindrical vacuum chamber wall;

an inner cylinder inside said vacuum chamber wall, said inner cylinder supporting substrate chambers for rotation relative to said vacuum chamber wall;

said vacuum chamber wall having openings therein with which the substrate chambers can be aligned and through which a three-dimensional substrate in the substrate chamber can be accessed;

the vacuum chamber supporting treatment stations and airlock stations tangential to and extending radially outwardly from the vacuum chamber wall, said stations each being associated with a respective opening in said vacuum chamber wall and being configured to communicate with the substrate chamber when aligned therewith;

said airlock stations being arranged diametrically opposite each other on the vacuum chamber wall;

substrate transport conveyors each operatively associated with a respective airlock station, said conveyors each alternating between transferring a three-dimensional substrate to the associated airlock station and transferring a three-dimensional substrate in the associated airlock station away therefrom, said transferring being performed dependent on turns of the inner cylinder;

said inner cylinder, when rotated a first turn, moving the substrate chamber communicating with the airlock stations to positions aligned with the openings communicating with the treatment stations, so that at least two three-dimensional substrates in said substrate chambers are simultaneously acted upon by treatment agents at the treatment stations, and, when said inner cylinder is rotated a further turn, said three-dimensional substrates and substrate chambers are moved to positions communicating with said airlock stations.

2. The vacuum treatment apparatus according to claim 1, wherein said inner cylinder has four substrate chambers of generally equal size and configuration arranged equidistantly about the circumference thereof, said inner cylinder being turned 90° by a motor for each work cycle.

3. The vacuum treatment apparatus according to claim 2, wherein the three-dimensional substrates are transported by said conveyors either into or away from the substrate chambers during the periods between each turn of the inner cylinder.

4. The vacuum treatment apparatus according to claim 2, wherein a three-dimensional substrate which was loaded into a substrate chamber before the start of the turning motion is transported out of the first substrate chamber and is moved away from the apparatus by a conveyor only after having completed a full revolution of the inner cylinder.

5. The vacuum treatment apparatus according to claim 1, wherein a three-dimensional substrate which is loaded from the conveyor into a substrate chamber, is unloaded after one half revolution (180°) of the inner cylinder through the airlock station opposite to the airlock station through which the three-dimensional substrate entered the vacuum chamber and is moved away from the apparatus by the associated conveyor.

6. The vacuum treatment apparatus according to claim 2, wherein a three-dimensional substrate is loaded from one of the conveyors into the substrate chamber through one of said airlock stations is transported in a first rotational direction, in a first work cycle to one of the treatment stations and, in a second work cycle, is transported back from said treatment station, in a direction opposite to said airlock station and is deposited onto said conveyor.

7. The vacuum treatment apparatus according to claim 5, wherein before the first work cycle, another three-dimensional substrate is loaded into the substrate chamber at the opposite airlock station by a second conveyor, said other three-dimensional substrate being moved back to another of the treatment stations and being transported, in a second work cycle, back to the airlock station and onto the second conveyor.

8. The vacuum chamber treatment apparatus according to claim 2, wherein said vacuum chamber has an outer wall enclosing said vacuum chamber wall and supporting said airlock and treatment stations.

* * * * *